United States Patent
Nakamura

(10) Patent No.: US 10,935,873 B2
(45) Date of Patent: Mar. 2, 2021

(54) IMAGING DEVICE

(71) Applicant: NIDEC COPAL CORPORATION, Tokyo (JP)

(72) Inventor: Yuta Nakamura, Tokyo (JP)

(73) Assignee: NIDEC COPAL CORPORATION, Tokyo (JP)

( * ) Notice: Subject to any disclaimer, the term of this patent is extended or adjusted under 35 U.S.C. 154(b) by 0 days.

(21) Appl. No.: 16/499,354

(22) PCT Filed: Mar. 30, 2018

(86) PCT No.: PCT/JP2018/013588
§ 371 (c)(1),
(2) Date: Sep. 30, 2019

(87) PCT Pub. No.: WO2018/181890
PCT Pub. Date: Oct. 4, 2018

(65) Prior Publication Data
US 2020/0057357 A1    Feb. 20, 2020

(30) Foreign Application Priority Data

Mar. 31, 2017    (JP) .............................. JP2017-069426

(51) Int. Cl.
G03B 17/02        (2006.01)
H04N 5/225       (2006.01)

(52) U.S. Cl.
CPC ........... *G03B 17/02* (2013.01); *H04N 5/2253* (2013.01); *H04N 5/2254* (2013.01)

(58) Field of Classification Search
None
See application file for complete search history.

(56) References Cited

U.S. PATENT DOCUMENTS

| 6,359,652 | B1* | 3/2002 | Takada | H04N 5/2253 235/439 |
| 2006/0171704 | A1* | 8/2006 | Bingle | H04N 5/2254 396/419 |
| 2016/0182868 | A1* | 6/2016 | Izawa | F25D 23/04 62/125 |

(Continued)

FOREIGN PATENT DOCUMENTS

| JP | 9-214819 A | 8/1997 |
| JP | 2006-351929 A | 12/2006 |

(Continued)

OTHER PUBLICATIONS

International Search Report issued in International Patent Application No. PCT/JP2018/013588 dated May 22, 2018.

Primary Examiner — William B Perkey
(74) Attorney, Agent, or Firm — Troutman Pepper Hamilton Sanders LLP

(57) ABSTRACT

An imaging device, having a substrate for mounting an imaging portion; a lens barrel for holding a lens group; a shield plate covering the vicinity of the substrate; a case disposed so as to cover the lens barrel, the substrate, and the shield plate; and a coupling, for connecting the substrate and another member, connected electrically to the ground electropotential, and a biasing portion that contacts the coupling so as to receive a biasing force in the optical axial direction.

4 Claims, 5 Drawing Sheets

(56) References Cited

U.S. PATENT DOCUMENTS

| | | | | |
|---|---|---|---|---|
| 2016/0191863 A1* | 6/2016 | Minikey, Jr. | ......... | H04N 5/2251 |
| | | | | 348/148 |
| 2018/0164603 A1* | 6/2018 | Taguchi | ............... | G02B 27/646 |
| 2018/0255213 A1* | 9/2018 | Ahn | ........................ | B60R 11/04 |
| 2020/0252527 A1* | 8/2020 | Nakamura | ........... | H04N 5/2252 |

FOREIGN PATENT DOCUMENTS

| | | | |
|---|---|---|---|
| JP | 2007-28430 | A | 2/2007 |
| JP | 2011-164461 | A | 8/2011 |
| JP | 2011-259101 | A | 12/2011 |
| JP | 2013-109188 | A | 6/2013 |
| JP | 2015-216444 | A | 12/2015 |

\* cited by examiner

[FIG. 1]
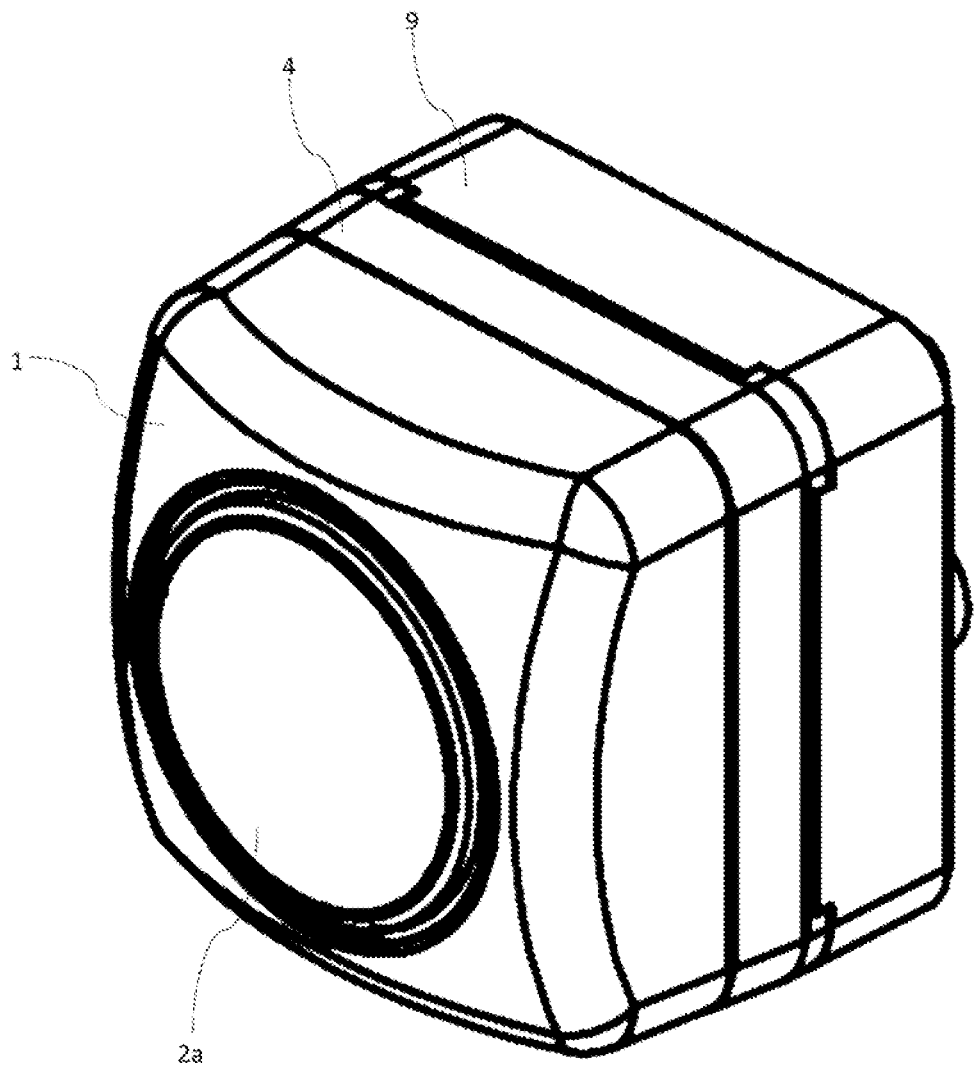

[FIG. 2]
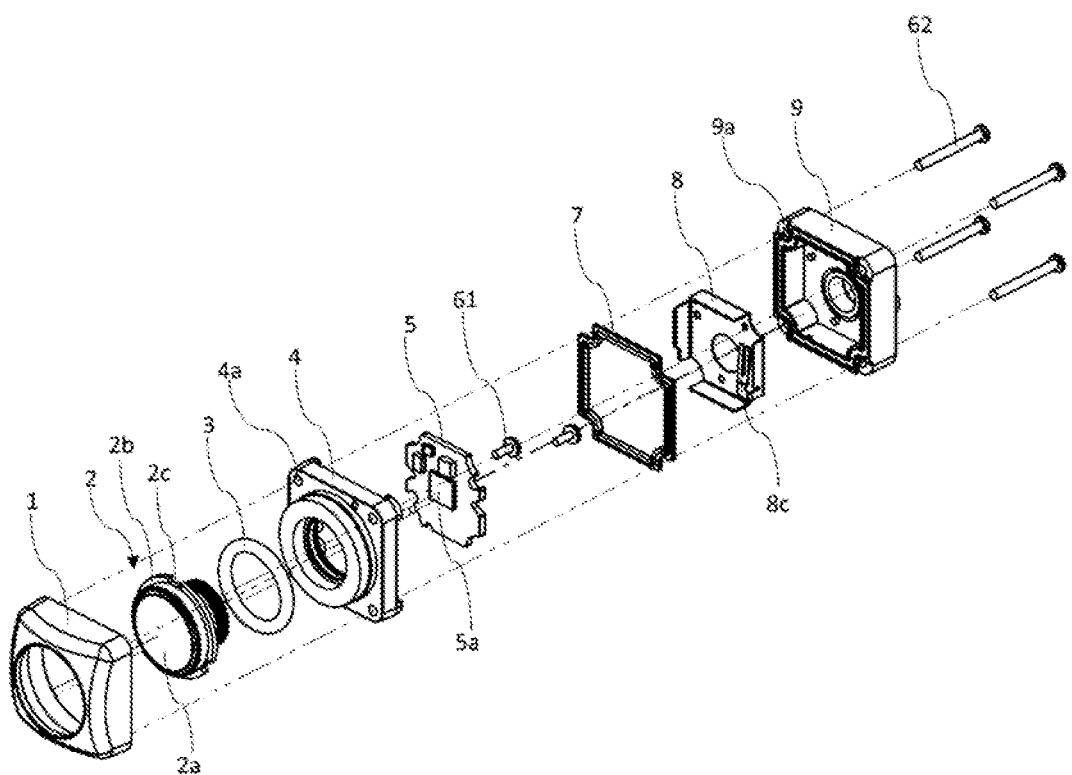

[FIG. 3]
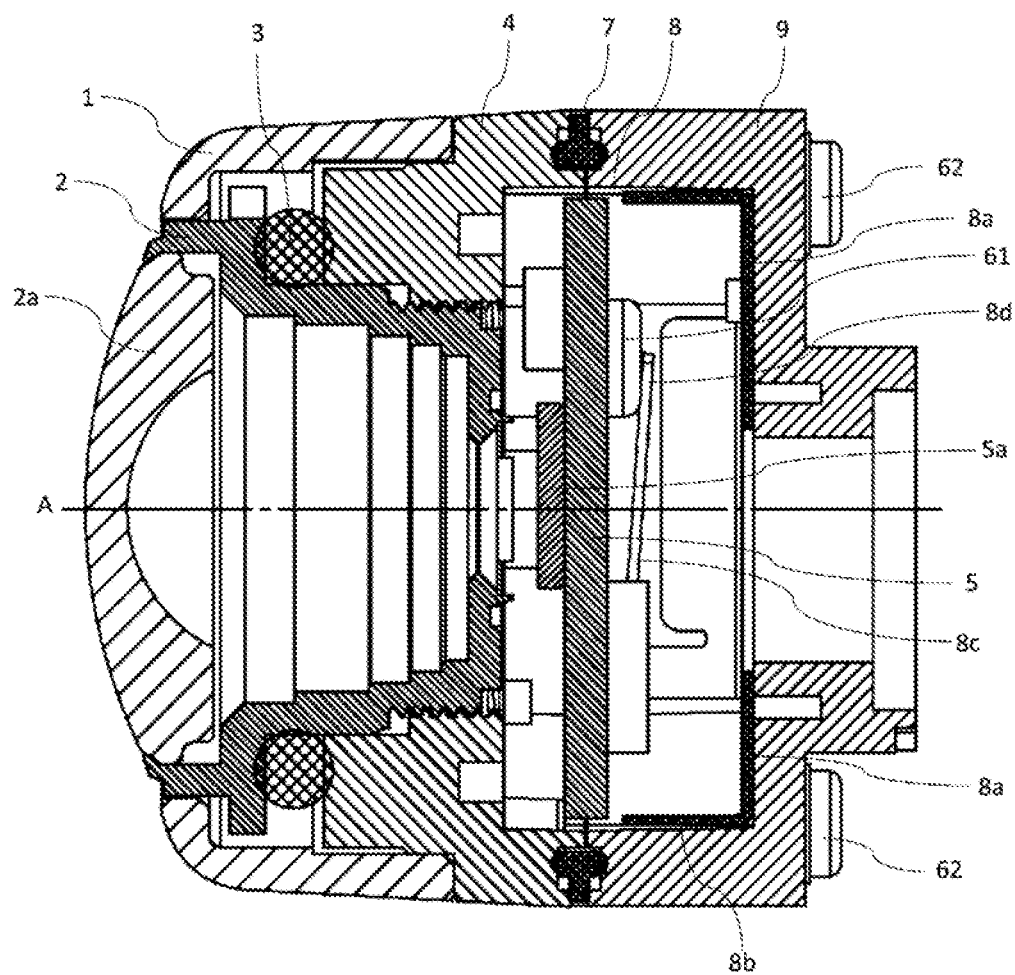

[FIG. 4]
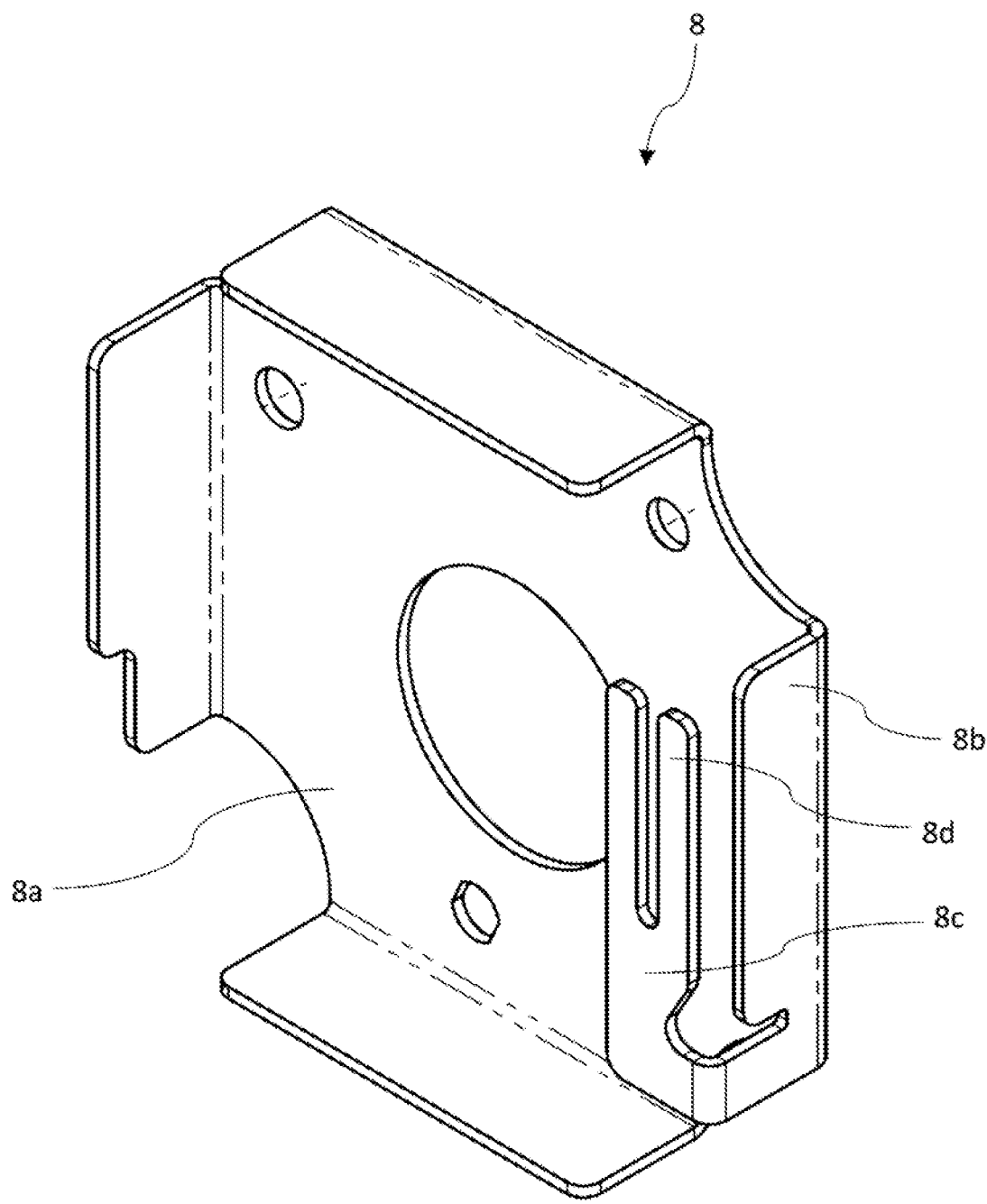

[FIG. 5]
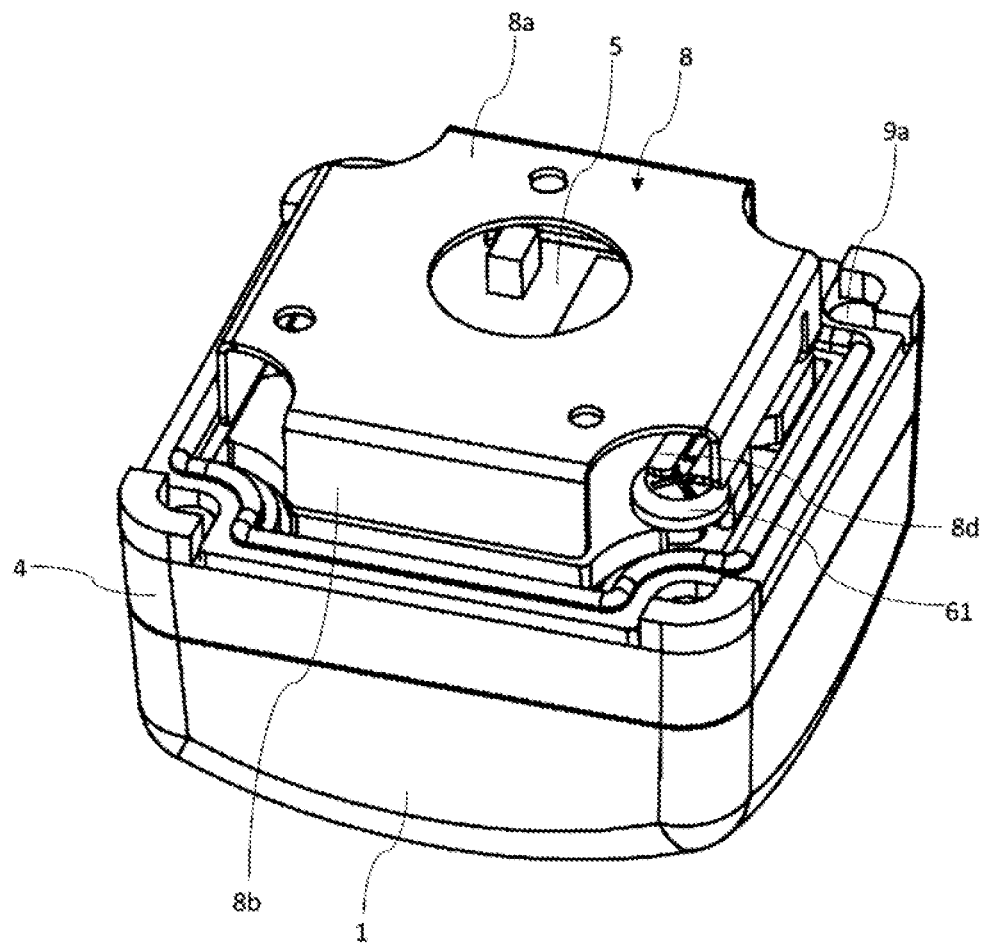

IMAGING DEVICE

CROSS-REFERENCE TO RELATED APPLICATIONS

This Application is a National Stage of International Application No. PCT/JP2018/013588 filed Mar. 30, 2018 which claims priority to Japanese Application No. 2017-069426 filed Mar. 31, 2017. All of the applications above are incorporated herein by reference.

FIELD OF TECHNOLOGY

One aspect of the present invention relates to an imaging device.

BACKGROUND

Sometimes imaging devices, wherein the lens barrel and a substrate upon which an imaging element is mounted are contained within a case, are structured through the provision of a shield plate that covers the area around the substrate on which the imaging element is mounted, as a noise countermeasure. Japanese Unexamined Patent Application Publication 2011-164461 discloses a camera device that is structured through the provision of a shield case for blocking electromagnetic radiation. Some structures that are provided with shield plates in this way use structures wherein the shield plate is grounded. Japanese Unexamined Patent Application Publication 2006-351929 discloses a structure wherein a shield member is electrically connected to the ground pattern of a substrate through a screw member.

SUMMARY

On the other hand, in recent years vehicle-mounted cameras have become ubiquitous. In such vehicle-mounted cameras, the space for mounting is limited, and thus conventionally there have been strong demands for further miniaturization. Moreover, there have also been demands for miniaturization in imaging devices other than vehicle-mounted cameras. To this point, miniaturization has been limited in imaging devices that are equipped with shield plates of conventional structures.

The present invention adopts means such as the following in order to solve the problem described above. Note that while in the explanation below, reference symbols from the drawings are written in parentheses for ease in understanding the present invention, the individual structural elements of the present invention are not limited to those that are written, but rather should be interpreted broadly, in a range that could be understood technically by a person skilled in the art.

One example according to the present invention is an imaging device, having a substrate for mounting an imaging portion; a lens barrel (2) for holding a lens group; a shield plate (8) covering the vicinity of the substrate; a case (1, 9) disposed so as to cover the lens barrel, the substrate, and the shield plate; and a coupling (61), for connecting the substrate and another member, connected electrically to the ground electropotential, wherein: the shield plate has a biasing portion (8c) that contacts the coupling so as to receive a biasing force in the optical axial direction.

In the imaging device of the structure set forth above, the shield plate is connected to the ground electropotential through the biasing portion, thus eliminating the need for the shield plate to have a screw hole to be connected by a screw, enabling the formation of a shield plate with a relatively small area. Moreover, because the shield plate is connected to the ground electropotential through contact between the coupling and the biasing portion of the shield plate, there is no need to form a pattern on the substrate for contacting the shield plate, making it easy to secure mounting space on the substrate. This enables a reduction in the size of the substrate. Additionally, because the use of a coupling such as a screw provides some degree of gap between the substrate and the end portion of the shield plate, this can prevent shorting due to contact between the shield plate and an electronic component or interconnection of the substrate.

In the imaging device set forth above in the biasing portion (8c), the end portion is divided into two or more portions, and each of the two or more end portions is in contact with an aforementioned coupling.

An imaging device of the structure set forth above facilitates maintenance of a state wherein at least one of the two or more end portions will be in contact with the ground electropotential, even when the shield plate has undergone vibration through a physical shock or a vibration, because the end portions of the biasing portion that has been divided into two or more portions are in contact with the ground electropotential while the shield plate is secured stably by the biasing portion. Because of this, this is able to prevent the shield plate from being separated from the ground electropotential. This enables a structure that can easily prevent the incursion of electromagnetic noise from outside into the imaging portion, and the like, that are mounted on the substrate.

In the imaging device set forth above the shield plate (8) has a flat face portion (8a) that is perpendicular to the optical axial direction; and a side face portion (8b) that extends from the flat face portion toward the optical axial direction, covering the outside of the substrate, wherein the biasing portion (8c) is a leaf spring portion (8d) that extends from the side face portion (8b).

Given the imaging device of the structure set forth above, the leaf spring portion that extends from the side face portion contacts the ground electropotential, making it possible to prevent shorting by the flat face portion of the shield plate contacting a lead wire that is disposed in the vicinity of the ground electropotential.

In the imaging device set forth above the shield plate (8) has a flat face portion (8a) that is perpendicular to the optical axial direction; and a side face portion (8b) that extends from the flat face portion toward the optical axial direction, covering the outside of the substrate, wherein: the biasing portion (8c) is a leaf spring portion that is formed on the flat face portion (8a).

In the imaging device of the structure set forth above, the structure is such that the leaf spring portion of the flat face portion contacts the ground electropotential, enabling the biasing portion to be formed relatively easily.

BRIEF DESCRIPTIONS OF THE DRAWINGS

FIG. 1 is an exterior perspective diagram of an imaging device according to the present example.

FIG. 2 is an assembly perspective diagram of an imaging device according to the present example.

FIG. 3 is a cross-sectional diagram of an imaging device according to the present example.

FIG. 4 is a perspective diagram of a shield plate according to an example.

FIG. 5 is a perspective diagram in a state wherein the rear case has been removed in an imaging apparatus according to an example.

DETAILED DESCRIPTION

In an imaging device according to the present invention, one distinctive feature is the point that a shield plate that is disposed covering a substrate has a leaf spring portion, where the leaf spring portion makes contact with a coupling that is connected to the ground electropotential of the substrate while applying a biasing force thereto.

In this Specification, the position of the center of the lens, that is, the position of the center of the light that is incident into the imaging element, is termed the "optical axis." The object that is imaged, positioned on the side of the lens that is opposite from the imaging element, will be termed the "imaging subject." The direction in which the imaging subject is position, in respect to the imaging element, will be termed the "front side" or "optical axial forward direction," and the direction at which the imaging element is positioned, in respect to the imaging subject, will be termed the "rear side" or "optical axial rearward direction."

An example according to the present invention will be explained following the structures below. However, the example explained below is no more than an example of the present invention, and must not be interpreted as limiting the technical scope of the present invention. Note that in the various drawings, identical reference symbols are assigned to identical structural elements, and explanations thereof.

Examples according to the present invention will be explained in reference to the drawings. FIG. 1 is an external perspective diagram of an imaging device according the present example viewed from the front side. FIG. 2 is an assembly perspective diagram of an imaging device according the present example viewed from the front side. FIG. 3 is a cross-sectional diagram of the imaging device according to the present example. "A" shown in the figure indicates the optical axis.

As depicted in FIG. 1 through FIG. 3, an imaging device according to the present example is structured including a front case 1, a lens barrel 2, a waterproofing seal 3, a lens flange 4, a substrate 5, a waterproofing seal 7, a shield plate 8, a rear case 9, and couplings 61 and 62.

<Front Case 1>

The front case 1 is a member for forming the case of the imaging device, together with the rear case 9, which is disposed to the rear in the optical axial direction, and is formed from resin, or the like. The lens flange 4 is disposed so as to be held between the front case 1 and the rear case 9. The front case 1 has an opening portion, centered on the optical axis, in the optical axial forward direction, and, in the optical axial rearward direction, is open, so as to be able to connect to the lens flange 4 rear case 9, and has side faces have essentially a rectangular shape in the cross-section thereof, so as to cover the optical axis. A space for containing the lens barrel 2, the substrate 5, and the like, is formed through connecting together the front case 1, the lens flange 4, at the rear case 9. As depicted in FIG. 1, a lens 2a, which is held by the lens barrel 2, is positioned at an opening portion, in the optical axial forward direction, of the front case 1, and the inner radius of the front case 1 and the outer radius of the lens barrel 2 are fitted radially. The front case 1 has a coupling groove (not shown) into which the coupling 62 is inserted, in a position that is further to the outside, in respect to the optical axis, than the waterproofing seal 3. The coupling groove is a groove-shaped part that is formed extending in a direction that is the horizontal (i.e. parallel) to the optical axis, from the optical axial rearward direction toward the front.

<Rear Case 9>

The rear case 9 is disposed further toward the optical axial rearward direction than the front case 1 and the lens flange 4. As described above, the rear case 9 forms a space for containing the lens barrel 2, the substrate 5, and the like, through coupling with the front case 1 and the lens flange 4. The rear case 9 is a plate-shaped member having a surface that is essentially perpendicular to the optical axis. The rear case 9 has a connecting hole 9a into which is inserted the coupling 62, at a position that is further to the outside, in respect to the optical axis, than the waterproofing seal 3. The connecting hole 9a is a through hole that extends in a direction that is horizontal (i.e. parallel) to the optical axis. The rear case 9 is connected to the lens flange 4 and the front case 1 through a coupling 62 that is inserted into the connecting hole 9a from the optical axial rearward direction.

<Lens Barrel 2>

The lens barrel 2 is a cylindrical member that extends in the optical axial direction, and holds one or more optical members, including the lens 2a. Optical members held in the lens barrel 2 include, in addition to the lens 2a, lenses, spacers, aperture plates, optical filters, and the like. The lens that includes the lens 2a is formed from a raw material that has transparency, such as glass, plastic, or the like, and refracts and transmits, in the optical axial rearward direction, the light from the optical axial forward direction. The spacers are flat annular ring-shaped members having an appropriate thickness in the optical axial direction, to adjust the positions of the individual lenses in the optical axial direction. The spacers have opening portions in the center portions thereof, including the optical axis. The aperture plate determines the outermost position of the light that passes therethrough. The optical filters suppress or block light of prescribed wavelengths. Optical filters include, for example, infrared radiation cut filters that reduce the infrared radiation that passes therethrough. The number of these optical members can be changed arbitrarily.

The lens barrel 2 engages, through screw-fitting, with the lens flange 4, which is disposed in the optical axial rearward direction. Screw threads are formed on the radial outside of the lens barrel 2, and screw together with screw threads of the lens flange 4. The lens barrel 2 is inserted, in respect to the lens flange 4, through rotation in respect to the lens flange 4. That is, the relative positioning with the lens flange 4 in the optical axial direction changes depending on the amount to which the lens barrel 2 is screwed into the lens flange 4. That is, the lens barrel 2 and the lens flange 4 are screwed together. Note that the lens barrel 2 in the lens flange 4 make may be cam-fitted instead of screw-fitted.

The lens barrel 2 has a protruding portion 2b that extends in a ring shape to the outside in the radial direction. The protruding portion 2b has a notch portion 2c at a prescribed position in the circumferential direction, where a catch portion for catching hardware that is used for adjusting the focus is formed thereby. When adjusting the position of the lens barrel 2 in respect to the imaging element 5a, the hardware being caught by the catch portion, which comprises the protruding portion 2b and the notch portion 2c, rotates the lens barrel 2, changing the amount to which the lens barrel 2 is screwed into the lens flange 4. The protruding portion 2b and notch portion 2c of the lens barrel 2 are covered by the front case 1 so as to not be visible to the outside in a state wherein the imaging device is assembled.

<Waterproofing Seal 3>

The waterproofing seal 3 is a circular ring-shaped member formed from an elastic material such as rubber, and is disposed between the lens barrel 2 and the lens flange 4 in the optical axial direction (referencing FIG. 3). The waterproofing seal 3 is supported by the lens barrel 2 and the lens flange 4 while being compressed, in the optical axial direction, by the lens barrel 2 and the lens flange 4.

<Lens Flange 4>

The lens flange 4 is a member that is disposed in the optical axial rearward direction of the lens barrel 2. The lens flange 4 is connected to the lens barrel 2 through screwing, through the lens barrel 2 being inserted into the radial-direction inside thereof. The lens flange 4 has a connecting hole 4*a* into which is inserted the coupling 62, at a position that is further to the outside, in respect to the optical axis, than the waterproofing seal 3. The connecting hole 4*a* is a through hole that extends in a direction that is horizontal (i.e. parallel) to the optical axis. The lens flange 4 is connected to the rear case 9 and the front case 1 by the coupling 62.

<Substrate 5>

The substrate 5 is a rigid substrate upon which are mounted electronic components, including the imaging element 5*a*. An imaging element 5*a* and electronic elements are installed on the substrate 5. The electric signals acquired from the imaging element 5*a* are subjected to prescribed electronic processing or signal processing by the electronic components that are mounted on the substrate 5, and then outputted as image data to outside of the imaging device.

The substrate 5 has a ground electropotential pattern structured from an electrical conductor. On the other hand, the substrate 5 is connected to the lens flange 4 through the coupling 61. The coupling 61 is disposed so as to contact a portion of the ground electropotential pattern.

The imaging element 5*a* is a photoelectric converting element for converting the incident light into electric signals, and is, for example, a CMOS sensor, a CCD, or the like, although there is no limitation thereto. Moreover, in the imaging device, an imaging portion other than the imaging element 5*a*, having an imaging function, may be used instead. The imaging element may be a portion, other than an imaging element described above, able to perform imaging, and may be termed an "imaging portion."

<Coupling 61>

The coupling 61 is, for example, a screw that has a head portion and a shaft portion, and connects the substrate 5 and the lens flange 4. The coupling 61 is formed from an electrically conductive material. The coupling 61 contacts the ground electropotential pattern of the substrate 5, to thereby go to the ground electropotential. As described below, the head portion of the coupling 61 contacts an end portion 8*d* of the leaf spring portion 8*c* of the shield plate 8.

<Waterproofing Seal 7>

The waterproofing seal 7 is a member that is formed from an elastic material such as rubber, as with the waterproofing seal 3, and is disposed between the front case 1 and the rear case 9, to connect the front case 1 and the rear case 9 without a gap. The waterproofing seal 7 has a shape corresponding to the connecting surface of the front case 1 and the rear case 9, where the waterproofing seal 7 in the present example is a rectangle with a corner portion cutaway.

<Shield Plate 8>

The shield plate 8 is formed from an electrically conductive plate-shaped member, and, in the assembled state, is disposed so as to cover at least a portion of the substrate 5.

FIG. 4 is a perspective diagram of a shield plate 8 according to the present example. As depicted in FIG. 4, the shield plate 8 is structured including a flat face portion 8*a* and a side face portion 8*b*. The flat face portion 8*a* is a plate-shaped part that is formed on a plane that is perpendicular to the optical axis. The side face portion 8*b* is a part that extends from an end portion of the flat face portion 8*a* toward the optical axial forward direction. The side face portion 8*b*, when viewed in a plane that is perpendicular to the optical axis, is positioned so as to cover the substrate 5, from the center of the optical axis A to the outer periphery position on the outside. The flat face portion 8*a* is positioned so as to cover at least a portion of the substrate 5 in the optical axial rearward direction.

The shield plate 8 has a leaf spring portion 8*c* that extends from the side face portion 8*b* in the direction that approaches the optical axis, and is inclined in respect to the flat face portion 8*a*. The end portion 8*d*, in the direction of extension of the leaf spring portion 8*c*, is divided in two parts, to form a fork. That is, the end portion 8*d* of the leaf spring portion 8*c* has a shape that is branched in two.

FIG. 5 is a perspective diagram of the imaging device according to the present example from the rear side in a state wherein the rear case 9 has been removed. As depicted in FIG. 5 and FIG. 3, each of the divided end portions 8*d* of the leaf spring portion 8*c* contact and bias the head portion of the coupling 61. As described above, the coupling 61 is connected electrically to the ground electropotential of the substrate 5, and thus, through the end portions 8*d* of the leaf spring portion 8*c* of the shield plate 8 contacting the coupling 61, the shield plate 8 will be at the ground electropotential.

<Coupling 62>

The coupling 62 is, for example, a screw, and is inserted from the optical axial rearward direction through the connecting hole 9*a* of the rear case 9 and the connecting hole 4*a* of the lens flange 4 into the coupling groove 1*a* of the front case 1. The coupling 62 connects together the front case 1, the rear case 9, and the lens flange 4, as a group, at a position that is further to the outside, in respect to the optical axis, than the waterproofing seal 3. Note that the coupling 62 may instead be a coupling such as a pin, instead of a screw.

In the imaging device according to the present example, as described above, the shield plate 8 contacts the ground electropotential of the substrate 5 through the leaf spring portion 8*c*, rather than through a coupling such as a screw. Because of this, there is no need for the shield plate 8 to have space for a screw hole, for connecting through a screw, or the surrounding part, enabling the shield plate 8 to be structured with a smaller area when compared to a configuration that has a screw hole. Moreover, the coupling 61 that connects the substrate 5 and the lens flange 4 is in contact with the end portion 8*d* of the leaf spring portion 8*c* of the shield plate 8, and thus the structure is such that the shield plate 8 goes to the ground electropotential through the coupling 61. Because of this, there is no need to form a ground electropotential pattern on the substrate 5 for contacting the shield plate 8, making it easy to secure mounting space on the substrate 5. Additionally, because a screw, or the like, is used for the coupling 61, some degree of gap is provided between the substrate 5 and the end portion 8*d* of the shield plate 8, making it possible to prevent shorting through the shield plate 8 contacting an electronic component or an interconnection on the substrate 5.

Moreover, in the imaging device according to the present example, the end portions 8*d*, which are divided in two, of the leaf spring portion 8*c* of the shield plate 8 contact the ground electropotential, to cause the shield plates 8 to be at the ground electropotential. This structure facilitates maintaining a state wherein at least one of the end portions 8d is in contact with the coupling 61, even when the shield plate has undergone vibration through the imaging device having undergone a physical shock or vibration from the outside, thus making it possible to prevent the shield plate 8 from becoming separated from the electropotential, to prevent loss of the electromagnetic noise shielding effect. Moreover, because the position of the shield plate 8 is secured while receiving a biasing force, this can reduce the likelihood of the position thereof shifting due to physical shock or vibration from the outside.

Moreover, the imaging device according to the present example is structured with the leaf spring portion 8c having a shape that extends from the side face portion 8b of the shield plate 8, with the end portion 8d of the leaf spring portion 8c contacting the coupling 61. Because of this, the positioning of the shield plate 8, other than the leaf spring portion 8c, can be maintained at a given distance from the substrate 5, making it possible to prevent contact of any position of the shield plate 8 with any pattern, or the like, of the substrate 5 other than the ground electropotential. This makes it possible to prevent the occurrence of shorting.

On the other hand, the leaf spring portion 8c may be structured so as to be formed in the flat face portion 8a of the shield plate 8. This case makes it easy to process the leaf spring portion 8c.

<2. Supplementary Items>

An example according to the present invention was explained in detail above. The explanation above is no more than an explanation of one form of example, and the scope of the present invention is not limited to this form of example, but rather is interpreted broadly, in a scope that can be understood by one skilled in the art.

For example, the front case 1 and rear case 9, explained in the examples, are not limited to the configurations depicted in the examples. For example, the shape may instead be one wherein the front case 1 is a plate-shaped member that forms a plane that is essentially perpendicular to the optical axial direction, with the rear case 9 having a plate-shaped member, formed in a plane that is essentially perpendicular to the optical axial direction, and side faces that protrude in the optical axial forward direction from the outer edge portion of the plate-shaped member. That is, the front case 1 and the rear case 9 may employ arbitrary shapes that form a case through connecting together. Moreover, the front case 1 and rear case 9 may be formed from a material other than resin.

Moreover, while in the imaging device according to the example of a structure wherein the end portion 8d of the leaf spring portion 8c was divided in two was used as an example, the end portion 8d may be divided into three or more. Moreover, the end portion 8d need not necessarily be divided.

The present invention can be used suitably for imaging devices, or the like, for vehicle mounting.

The invention claimed is:

1. An imaging device, comprising:
a substrate mounting an imaging portion;
a lens barrel holding a lens group;
a shield plate covering the vicinity of the substrate;
a case disposed so as to cover the lens barrel, the substrate, and the shield plate; and
a coupling, connecting the substrate and another member, connected electrically to the ground electropotential, wherein:
the shield plate has a biasing portion that contacts the coupling so as to receive a biasing force in the optical axial direction.

2. The imaging device as set forth in claim 1, wherein:
in the biasing portion, the end portion is divided into two or more portions, and each of the two or more end portions is in contact with an aforementioned coupling.

3. The imaging device as set forth in claim 1, wherein the shield plate comprises:
a flat face portion that is perpendicular to the optical axial direction; and
a side face portion that extends from the flat face portion toward the optical axial direction, covering the outside of the substrate, wherein:
the biasing portion is a leaf spring portion that extends from the side face portion.

4. The imaging device as set forth in claim 1, wherein the shield plate comprises:
a flat face portion that is perpendicular to the optical axial direction; and
a side face portion that extends from the flat face portion toward the optical axial direction, covering the outside of the substrate, wherein:
the biasing portion is a leaf spring portion that is formed on the flat face portion.

* * * * *